US010622491B2

(12) United States Patent
Chen et al.

(10) Patent No.: US 10,622,491 B2
(45) Date of Patent: Apr. 14, 2020

(54) WELL DOPING FOR METAL OXIDE SEMICONDUCTOR (MOS) VARACTOR

(71) Applicant: QUALCOMM Incorporated, San Diego, CA (US)

(72) Inventors: Chuan-Hsing Chen, San Diego, CA (US); Chuan-cheng Cheng, San Diego, CA (US); Yun Yue, San Diego, CA (US); Ye Lu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/119,914

(22) Filed: Aug. 31, 2018

(65) Prior Publication Data

US 2019/0393359 A1 Dec. 26, 2019

Related U.S. Application Data

(60) Provisional application No. 62/688,287, filed on Jun. 21, 2018.

(51) Int. Cl.
*H01L 21/00* (2006.01)
*H01L 29/00* (2006.01)
*H01L 29/93* (2006.01)
*H01L 21/225* (2006.01)
*H01L 29/66* (2006.01)
*H04B 1/40* (2015.01)

(52) U.S. Cl.
CPC .......... *H01L 29/93* (2013.01); *H01L 21/2254* (2013.01); *H01L 29/66174* (2013.01); *H04B 1/40* (2013.01)

(58) Field of Classification Search
CPC ... H01L 29/93; H01L 29/66174; H01L 29/94; H01L 29/6659; H01L 29/1083; H01L 21/2254; H01L 21/84; H01L 21/26513; H04B 1/40; H04B 1/3833
See application file for complete search history.

(56) References Cited

U.S. PATENT DOCUMENTS

| 4,621,205 | A | * | 11/1986 | Miller | H03B 5/02 327/526 |
| 5,362,981 | A | * | 11/1994 | Sato | H01L 21/823807 257/369 |
| 5,622,880 | A | * | 4/1997 | Burr | H01L 29/1045 257/E29.054 |
| 5,923,987 | A | * | 7/1999 | Burr | H01L 29/1045 257/E21.426 |
| 6,855,995 | B2 | * | 2/2005 | Altmann | H01L 27/0808 257/401 |

(Continued)

OTHER PUBLICATIONS

Li et al., "Simulation and Realization of MOS varactors", 2012, Procedia Engineering, 29, pp. 1645-1650, Dec. 2012.*

(Continued)

*Primary Examiner* — Nikolay K Yushin
(74) *Attorney, Agent, or Firm* — Seyfarth Shaw LLP

(57) ABSTRACT

A metal oxide semiconductor (MOS) varactor includes a first diffusion region of a first polarity and a second diffusion region of the first polarity on a semiconductor substrate. The MOS varactor further includes a channel between the first diffusion region and the second diffusion region on the semiconductor substrate. The channel has a surface dopant concentration less than $4e10^{17}$.

18 Claims, 10 Drawing Sheets

(56) References Cited

U.S. PATENT DOCUMENTS

| | | | | |
|---|---|---|---|---|
| 7,046,098 B2 * | 5/2006 | Staszewski | | H03L 7/085 |
| | | | | 331/158 |
| 7,276,746 B1 * | 10/2007 | Xu | | H01L 27/0629 |
| | | | | 257/199 |
| 7,700,453 B2 | 4/2010 | Coolbaugh et al. | | |
| 7,714,412 B2 | 5/2010 | Coolbaugh et al. | | |
| 7,923,818 B2 | 4/2011 | De | | |
| 8,106,481 B2 | 1/2012 | Rao | | |
| 8,273,617 B2 * | 9/2012 | Thompson | | H01L 21/823412 |
| | | | | 438/197 |
| 8,283,727 B1 * | 10/2012 | Walker | | H01L 29/0649 |
| | | | | 257/355 |
| 8,482,031 B2 * | 7/2013 | Udrea | | H01L 29/66325 |
| | | | | 257/141 |
| 8,747,318 B2 * | 6/2014 | Shiina | | A61B 8/08 |
| | | | | 600/438 |
| 8,822,291 B2 | 9/2014 | Zhang et al. | | |
| 8,853,022 B2 * | 10/2014 | Zhang | | H01L 29/4983 |
| | | | | 257/335 |
| 2003/0107442 A1 * | 6/2003 | Staszewski | | H03L 7/085 |
| | | | | 331/1 A |
| 2004/0063262 A1 * | 4/2004 | Feudel | | H01L 21/26513 |
| | | | | 438/197 |
| 2004/0198013 A1 * | 10/2004 | Johansson | | H01L 27/0658 |
| | | | | 438/329 |
| 2006/0006431 A1 | 1/2006 | Jean et al. | | |
| 2007/0210402 A1 * | 9/2007 | Chen | | H01L 29/93 |
| | | | | 257/480 |
| 2008/0003734 A1 * | 1/2008 | Chuang | | H01L 21/823807 |
| | | | | 438/199 |
| 2008/0079116 A1 * | 4/2008 | Yuan | | H01L 29/93 |
| | | | | 257/531 |
| 2008/0149983 A1 * | 6/2008 | Rassel | | H01L 29/93 |
| | | | | 257/312 |
| 2011/0057230 A1 * | 3/2011 | Udrea | | H01L 29/66325 |
| | | | | 257/141 |
| 2013/0181286 A1 * | 7/2013 | Zhang | | H01L 29/4983 |
| | | | | 257/335 |

OTHER PUBLICATIONS

Song et al, "An RF model of the accumulation-mode MOS varactor valid in both accumulation and depletion regions," IEEE Transactions on Electron Devices, 2003, vol. 50, No. 9, pp. 1997-1999, Sep. 2003.*

* cited by examiner

WELL DOPING FOR METAL OXIDE SEMICONDUCTOR (MOS) VARACTOR

CROSS-REFERENCE TO RELATED APPLICATION

The present application claims the benefit of U.S. Provisional Patent Application No. 62/688,287, filed Jun. 21, 2018, and titled "WELL DOPING FOR METAL OXIDE SEMICONDUCTOR (MOS) VARACTOR," the disclosure of which is expressly incorporated by reference herein in its entirety.

BACKGROUND

Field

Aspects of the present disclosure relate to semiconductor devices, and more particularly to a novel well doping for a metal oxide semiconductor (MOS) varactor.

Background

Designing mobile radio frequency (RF) chips (e.g., mobile RF transceivers) is complicated by the use of passive devices. In particular, the passive devices used in mobile RF transceivers directly affect analog/RF performance considerations, including mismatch, noise, and other performance considerations. Passive devices may involve high performance inductor and capacitor components. For example, an RF module (e.g., an RF front-end (RFFE) module) may include inductors (L) and capacitors (C) arranged to form filters and other RF devices. Arrangements of these passive devices may be selected to improve device performance, while suppressing unwanted noise for supported advanced RF applications, such as fifth generation (5G) communications.

The design of mobile RF transceivers may include the use of a voltage-controlled capacitance and/or a tunable capacitor (e.g., a varactor) for supporting the noted advanced RF applications. For example, tunable capacitors may provide RF and impedance matching in RF circuits of advanced RF applications. In these advanced RF technologies, MOS varactors having a high quality (Q)-factor are desired. Unfortunately, conventional MOS varactors may exhibit an undesirable quality factor due to increased parasitic resistance.

SUMMARY

A metal oxide semiconductor (MOS) varactor includes a first diffusion region of a first polarity on a semiconductor substrate. The MOS varactor also includes a second diffusion region of the first polarity on the semiconductor substrate. The MOS varactor further includes a channel between the first diffusion region and the second diffusion region on the semiconductor substrate. The channel has a surface dopant concentration less than $4e10^{17}$.

A method of fabricating a metal oxide semiconductor (MOS) varactor includes depositing a well implant block in a native transistor area of a semiconductor layer. The method also includes doping the semiconductor layer to form a doped semiconductor layer having an undoped native transistor area. The method further includes fabricating the MOS varactor to include the undoped native transistor area of the doped semiconductor layer.

A radio frequency (RF) front-end (RFFE) device includes a transceiver having a metal oxide semiconductor (MOS) varactor. The MOS varactor includes a first diffusion region of a first polarity on a semiconductor substrate. The MOS varactor also includes a second diffusion region of the first polarity on the semiconductor substrate. The MOS varactor further includes a channel between the first diffusion region and the second diffusion region on the semiconductor substrate. The channel has a surface dopant concentration less than $4 \, e10^{17}$. The RFFE device also includes an antenna coupled to an output of the transceiver.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
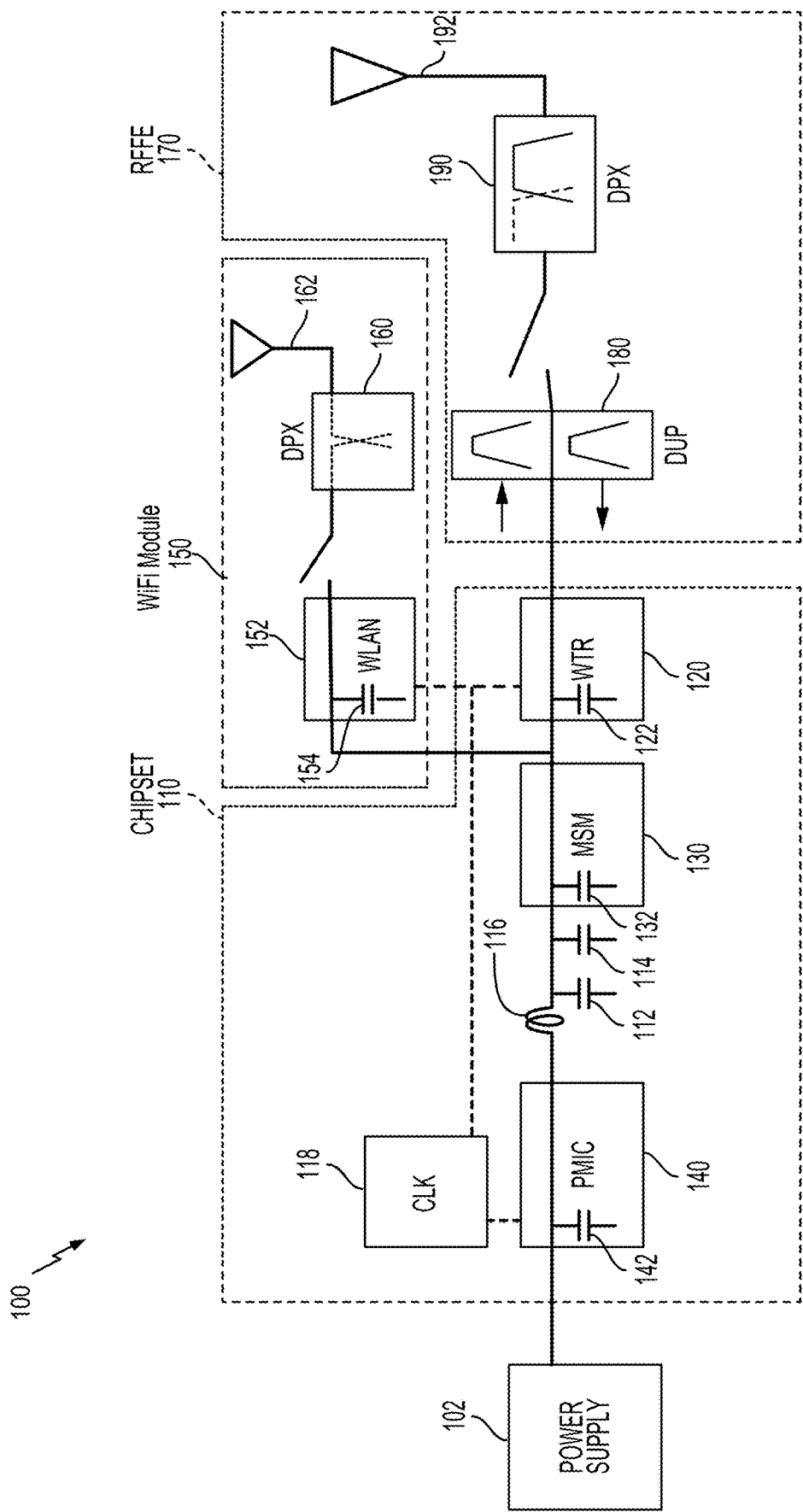
FIG. 1 is a schematic diagram of a radio frequency (RF) front-end (RFFE) module employing passive devices for a chipset.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

Based on the teachings, one skilled in the art should appreciate that the scope of the disclosure is intended to cover any aspect of the disclosure, whether implemented independently of or combined with any other aspect of the disclosure. For example, an apparatus may be implemented or a method may be practiced using any number of the aspects set forth. In addition, the scope of the disclosure is intended to cover such an apparatus or method practiced using other structure, functionality, or structure and functionality in addition to or other than the various aspects of the disclosure set forth. It should be understood that any aspect of the disclosure disclosed may be embodied by one or more elements of a claim.

The word "exemplary" is used herein to mean "serving as an example, instance, or illustration." Any aspect described herein as "exemplary" is not necessarily to be construed as preferred or advantageous over other aspects.

Although particular aspects are described herein, many variations and permutations of these aspects fall within the scope of the disclosure. Although some benefits and advantages of the preferred aspects are mentioned, the scope of the disclosure is not intended to be limited to particular benefits, uses or objectives. Rather, aspects of the disclosure are intended to be broadly applicable to different technologies, system configurations, networks and protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

As described herein, the use of the term "and/or" is intended to represent an "inclusive OR", and the use of the term "or" is intended to represent an "exclusive OR." As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Designing mobile radio frequency (RF) chips (e.g., mobile RF transceivers) is complicated by the use of passive devices. In particular, the passive devices used in mobile RF transceivers directly affect analog/RF performance considerations, including mismatch, noise, and other performance considerations. Passive devices may involve high performance inductor and capacitor components. For example, an RF module (e.g., an RF front-end (RFFE) module) may include inductors (L) and capacitors (C) arranged to form diplexers, triplexers, multiplexers, low pass filters, balun filters, and/or notch filters to prevent high order harmonics. Arrangements of these passive devices may be selected to improve device performance, while suppressing unwanted noise to support advanced RF applications, such as fifth generation (5G) communications.

A varactor is an example of an electrical device used to store energy (e.g., charge) in an electric field between closely spaced capacitor plates according to a capacitance value. In advanced RF circuits, a MOS varactor may provide a tunable capacitance value. This capacitance value provides a measure of the amount of charge stored by the capacitor at a certain voltage. In addition to their charge storing capability, capacitors are also useful as electronic filters because they enable differentiation between high frequency and low frequency signals. In a conventional varactor, a plate width modulates to vary an electric field formed between the capacitor plates. This varactor provides an electrically controllable capacitance that can be used in tuned circuits. While the use of varactors is advantageous in many applications (e.g., due to small size and reduced cost), varactors generally exhibit a lower quality (Q)-factor due to increased parasitic resistance and capacitance.

A conventional metal oxide semiconductor (MOS) variable capacitor (varactor) or "MosVar" exhibits a low tuning ratio (TR) value for providing variable capacitance. The low tuning ratio is generally due to a limited gate tuning capability of the conventional MosVar. In addition, the conventional MosVar exhibits a lower quality factor Q due to high parasitic resistance and undesired capacitance. The low tuning ratio TR and the low quality factor Q of the conventional MosVar affect varactor performance and subsequently impact RF circuit performance.

The varactor parameters include the Q-factor and the tuning ratio. The tuning ratio is a maximum capacitance (Cmax) to a minimum capacitance (Cmin) ratio (e.g., Cmax/Cmin). The quality factor may be defined as the imaginary part of varactor impedance divided by the real part of varactor impedance. A large tuning ratio TR and a high quality factor Q are desired for advanced RF circuit performance. Improving the tuning ratio TR of a MOS varactor may be achieved by either increasing Cmax or reducing Cmin; however, increasing Cmax reduces the quality factor Q. Increasing both the tuning ratio TR and the quality factor Q may be achieved by reducing Cmin, which may refer to a depletion capacitance of the MosVar.

The quality factor of a MOS varactor is conventionally improved by reducing the real part of the varactor impedance (e.g., its parasitic resistance). Rather than reducing the parasitic resistance, aspects of the present disclosure reduce the depletion capacitance of the MOS varactor. Various aspects of the present disclosure provide techniques for novel doping of a MOS varactor to reduce the depletion capacitance.

The process flow for semiconductor fabrication of a MOS varactor having the novel well doping may include front-end-of-line (FEOL) processes, middle-of-line (MOL) processes, and back-end-of-line (BEOL) processes. The middle-of-line interconnect layers for connecting a first BEOL layer (e.g., metal one (M1)) to the source/drain layer of an integrated circuit may be referred to as contact-to-active (CA) trench contacts. The middle-of-line interconnect layer for connecting M1 to the gates of an integrated circuit may be referred to as contact-to-open (CB) contacts.

It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms "chip" and "die" may be used interchangeably unless such interchanging would tax credulity.

According to aspects of the present disclosure, a lower dose deep N-well doping replaces a traditional uniform N-well doping used in conventional MOS varactors, for example. Aspects of the present disclosure reduce the depletion capacitance of a MOS varactor by applying the novel well doping. The reduced depletion capacitance can increase the tuning ratio TR (e.g., >15%), while substantially improving the quality factor Q (e.g., >200%) at depletion. Using a lower dose deep N-well doping has little negative impact on other parts of a radio frequency (RF) chip. The deep N-well doping also has little impact on other active devices in RF circuit chips.

FIG. 1 is a schematic diagram of a wireless device 100 (e.g., a cellular phone or a smartphone) having a varactor. The wireless device 100 may include a wireless local area network (WLAN) (e.g., WiFi) module 150 and a RF front-end module 170 for a chipset 110. The WiFi module 150 includes a first diplexer 160 communicably coupling an antenna 162 to a wireless local area network module (e.g., WLAN module 152). The RF front-end module 170 includes a second diplexer 190 communicably coupling an antenna 192 to the wireless transceiver 120 (WTR) through a duplexer 180 (DUP).

The wireless transceiver 120 and the WLAN module 152 of the WiFi module 150 are coupled to a modem (MSM, e.g., a baseband modem) 130 that is powered by a power supply 102 through a power management integrated circuit (PMIC) 140. The chipset 110 also includes capacitors 112 and 114, as well as an inductor(s) 116 to provide signal integrity. The PMIC 140, the modem 130, the wireless transceiver 120, and the WLAN module 152 each include capacitors (e.g., 142, 132, 122, and 154) and operate according to a clock 118. The geometry and arrangement of the various inductor and capacitor components in the chipset 110 may reduce the electromagnetic coupling between the components.

The wireless transceiver 120 of the wireless device generally includes a mobile RF transceiver to transmit and receive data for two-way communication. A mobile RF transceiver may include a transmit section for data transmission and a receive section for data reception. For data transmission, the transmit section may modulate a RF carrier signal with data to obtain a modulated RF signal, amplify the modulated RF signal using a power amplifier (PA) to obtain an amplified RF signal having the proper output power level, and transmit the amplified RF signal via the antenna 192 to a base station. For data reception, the receive section may obtain a received RF signal via the antenna 192 and may amplify the received RF signal using a low noise amplifier (LNA) and process the received RF signal to recover data sent by the base station in a communications signal.

The wireless transceiver 120 may include one or more circuits for amplifying these communications signals. The amplifier circuits (e.g., LNA/PA) may include one or more amplifier stages that may have one or more driver stages and one or more amplifier output stages. Each of the amplifier stages includes one or more transistors configured in various ways to amplify the communications signals. Various options exist for fabricating the transistors that are configured to amplify the communications signals transmitted and received by the wireless transceiver 120. The design of RF front-end module 100 may include the use of a voltage-controlled capacitance and/or a tunable capacitor (e.g., a varactor), for example.

Figure 2:
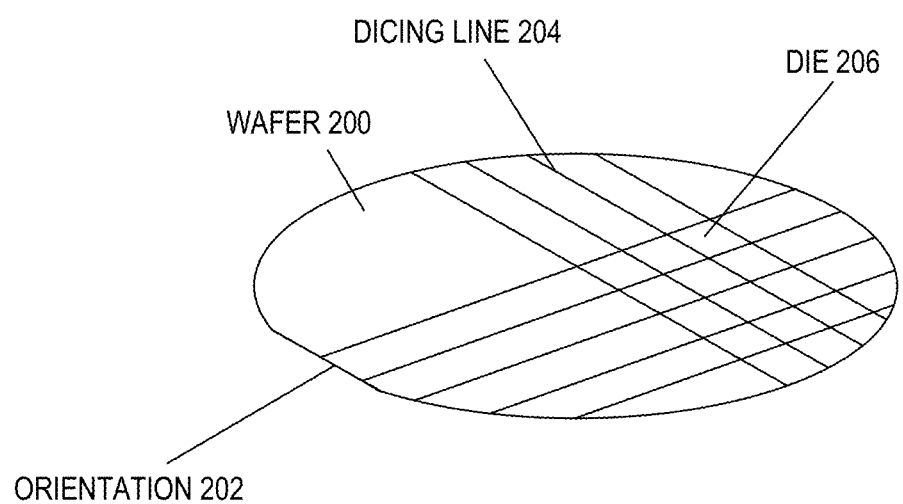
FIG. 2 illustrates a perspective view of a semiconductor wafer.

FIG. 2 illustrates a perspective view of a semiconductor wafer for fabricating a metal oxide semiconductor varactor, for example. A wafer 200 may be a semiconductor wafer, or may be a substrate material with one or more layers of semiconductor material on a surface of the wafer 200. When the wafer 200 is a semiconductor material, it may be grown from a seed crystal using the Czochralski process, where the seed crystal is dipped into a molten bath of semiconductor material and slowly rotated and removed from the bath. The molten material then crystalizes onto the seed crystal in the orientation of the crystal.

The wafer 200 may be a compound material, such as gallium arsenide (GaAs) or gallium nitride (GaN), a ternary material such as indium gallium arsenide (InGaAs), quaternary materials, or any material that can be a substrate material for other semiconductor materials. Although many of the materials may be crystalline in nature, polycrystalline or amorphous materials may also be used for the wafer 200.

The wafer 200, or layers that are coupled to the wafer 200, may be supplied with materials that make the wafer 200 more conductive. For example, and not by way of limitation, a silicon wafer may have phosphorus or boron added to the wafer 200 to allow for electrical charge to flow in the wafer 200. These additives are referred to as dopants, and provide extra charge carriers (either electrons or holes) within the wafer 200 or portions of the wafer 200. By selecting the areas where the extra charge carriers are provided, which type of charge carriers are provided, and the amount (density) of additional charge carriers in the wafer 200, different types of electronic devices may be formed in or on the wafer 200, such as the novel doped MOS varactor.

The wafer 200 has an orientation 202 that indicates the crystalline orientation of the wafer 200. The orientation 202 may be a flat edge of the wafer 200 as shown in FIG. 2, or may be a notch or other indicia to illustrate the crystalline orientation of the wafer 200. The orientation 202 may indicate the Miller Indices for the planes of the crystal lattice in the wafer 200.

Once the wafer 200 has been processed as desired, the wafer 200 is divided up along dicing lines 204. The dicing lines 204 indicate where the wafer 200 is being broken apart or separated into pieces. The dicing lines 204 may define the outline of the various integrated circuits that have been fabricated on the wafer 200.

Once the dicing lines 204 are defined, the wafer 200 may be sawn or otherwise separated into pieces to form the die 206. Each of the die 206 may be an integrated circuit with many devices or may be a single electronic device. The physical size of the die 206, which may also be referred to as a chip or a semiconductor chip, depends at least in part on the ability to separate the wafer 200 into certain sizes, as well as the number of individual devices that the die 206 is designed to contain.

Once the wafer 200 has been separated into one or more die 206, the die 206 may be mounted into packaging to allow access to the devices and/or integrated circuits fabricated on the die 206. Packaging may include single in-line packaging, dual in-line packaging, motherboard packaging, flip-chip packaging, indium dot/bump packaging, or other types of devices that provide access to the die 206. The die 206 may also be directly accessed through wire bonding, probes, or other connections without mounting the die 206 into a separate package.

Figure 3:
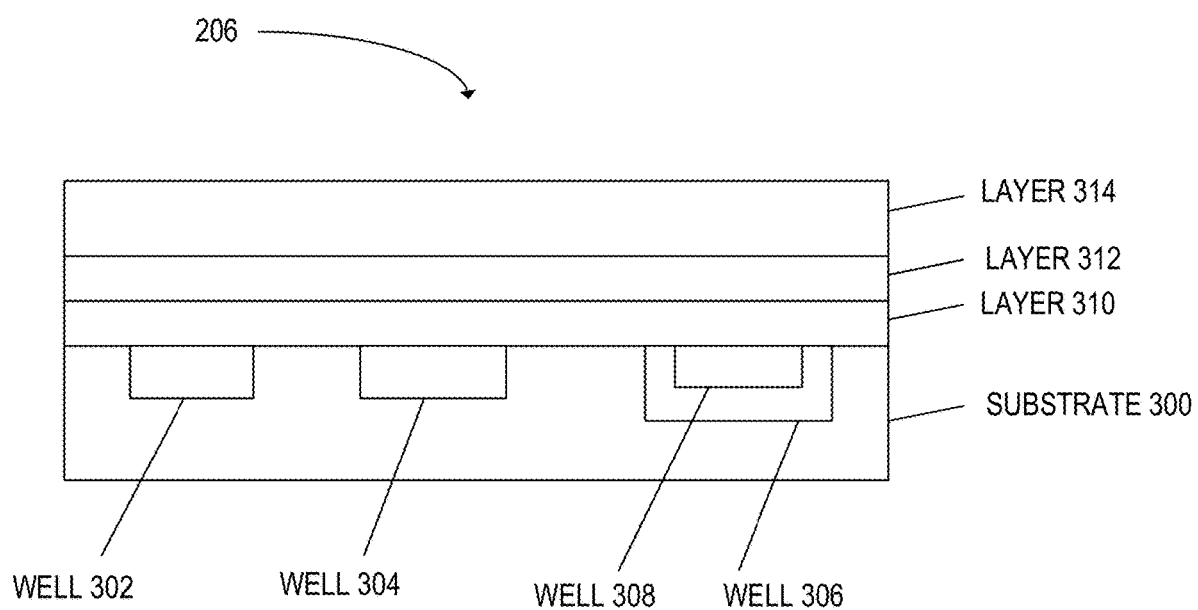
FIG. 3 illustrates a cross-sectional view of a die.

FIG. 3 illustrates a cross-sectional view of a die 206, which may include a MOS varactor in accordance with an aspect of the present disclosure. In the die 206, there may be a substrate 300, which may be a semiconductor material and/or may act as a mechanical support for electronic devices. The substrate 300 may be a doped semiconductor substrate, which has charge carriers (either electrons as designated N-channel or holes designated P-channel) present throughout the substrate 300. Subsequent doping of the substrate 300 with charge carrier ions/atoms may change the charge carrying capabilities of the substrate 300.

Within the substrate 300 (e.g., a semiconductor substrate), there may be wells 302 and 304, which may be the source and/or drain of a field-effect transistor (FET), or wells 302 and/or 304 may be fin structures of a fin structured FET (FinFET). Wells 302 and/or 304 may also be other devices (e.g., a resistor, a capacitor, a diode, or a MOS varactor) depending on the structure and other characteristics of the wells 302 and/or 304 and the surrounding structure of the substrate 300.

The semiconductor substrate may also have a well 306 and a well 308. The well 308 may be completely within the well 306, and, in some cases, may form a bipolar junction transistor (BJT). The well 306 may also be used as an isolation well to isolate the well 308 from electric and/or magnetic fields within the die 206.

Layers (e.g., 310 through 314) may be added to the die 206. The layer 310 may be, for example, an oxide or insulating layer that may isolate the wells (e.g., 302-308) from each other or from other devices on the die 206. In such cases, the layer 310 may be silicon dioxide, a polymer, a dielectric, or another electrically insulating layer. The layer 310 may also be an interconnection layer, in which case it may comprise a conductive material such as copper, tungsten, aluminum, an alloy, or other conductive or metallic materials.

The layer 312 may also be a dielectric or conductive layer, depending on the desired device characteristics and/or the materials of the layers (e.g., 310 and 314). The layer 314 may be an encapsulating layer, which may protect the layers (e.g., 310 and 312), as well as the wells 302-308 and the substrate 300, from external forces. For example, and not by way of limitation, the layer 314 may be a layer that protects the die 206 from mechanical damage, or the layer 314 may be a layer of material that protects the die 206 from electromagnetic or radiation damage.

Electronic devices designed on the die 206 may by composed of many features or structural components. For example, the die 206 may be exposed to any number of methods to impart dopants into the substrate 300, the wells 302-308, and, if desired, the layers (e.g., 310-314). For example, and not by way of limitation, the die 206 may be exposed to ion implantation, deposition of dopant atoms that are driven into a crystalline lattice through a diffusion process, chemical vapor deposition, epitaxial growth, or other methods. Through selective growth, material selection, and removal of portions of the layers (e.g., 310-314), and through selective removal, material selection, and dopant concentration of the substrate 300 and the wells 302-208, many different structures and electronic devices may be formed within the scope of the present disclosure.

Further, the substrate 300, the wells 302-308, and the layers (e.g., 310-314) may be selectively removed or added through various processes. Chemical wet etching, chemical mechanical planarization (CMP), plasma etching, photoresist masking, damascene processes, and other methods may create the structures and devices of the present disclosure. These wells 302-308 may be doped using a deep well doping to form a MOS varactor.

Figure 4:
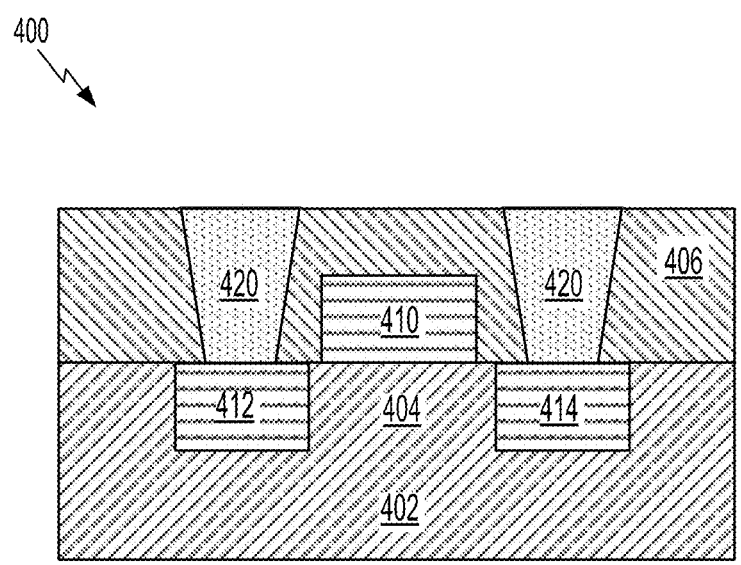
FIG. 4 illustrates a cross-sectional view of a metal oxide semiconductor (MOS) varactor having a novel well doping, according to aspects of the present disclosure.

FIG. 4 illustrates a cross-sectional view of a metal oxide semiconductor (MOS) varactor 400 having a novel well doping, according to aspects of the present disclosure. In advanced RF circuits, the MOS varactor 400 may provide a tunable capacitance. The MOS varactor 400 may include a first diffusion region 412, a second diffusion region 414, and a channel 404 formed between the first diffusion region 412 and the second diffusion region 414 in a substrate 402. A gate 410 is on the channel 404, and a gate dielectric (not shown) may be between the gate 410 and the channel 404. Middle-of-line trench contacts 420 (e.g., CA trench contacts) to the first diffusion region 412 and the second diffusion region 414 are also shown. In addition, the MOS varactor 400 includes a dielectric layer 406.

This MOS varactor 400 is an example of an electrical device used to store energy (e.g., charge) in an electric field between closely spaced capacitor plates (e.g., the gate 410 and the channel 404) according to a capacitance value. This capacitance value provides a measure of the amount of charge stored by the capacitor at a certain voltage. In the MOS varactor 400, a plate width (e.g., the channel 404) modulates (e.g., according to the first diffusion region 412 and the second diffusion region 414) to vary an electric field formed between the capacitor plates (e.g., the gate 410 and the channel 404).

The MOS varactor 400 provides an electrically controllable capacitance that can be used in tuned circuits. While the use of varactors is advantageous in many applications (e.g., due to small size and reduced cost), varactors generally exhibit a low quality (Q)-factor due to increased parasitic resistance and undesired capacitance.

Significant parameters of the MOS varactor 400 include the Q-factor and a tuning ratio (TR). The tuning ratio TR is a maximum capacitance (Cmax) to a minimum capacitance (Cmin) ratio (Cmax/Cmin). The quality factor may be defined as:

$$\text{Imaginary Part of Varactor Impedance/Real Part of Varactor Impedance} \qquad (1)$$

As illustrated by EQUATION (1), the quality factor Q of the MOS varactor 400 may be improved by reducing the real part of the varactor impedance (e.g., its parasitic resistance). It is recognized that a large tuning ratio TR and a high quality factor Q are desired for advanced RF circuit performance. Improving the tuning ratio TR of the MOS varactor 400 may be achieved by either increasing Cmax or reducing Cmin; however, increasing Cmax reduces the quality factor Q.

The quality factor of the MOS varactor 400 may be conventionally improved by reducing the real part of the varactor impedance (e.g., the parasitic resistance). Rather than reducing the parasitic resistance, aspects of the present disclosure reduce the depletion capacitance of the MOS varactor. That is, increasing both the tuning ratio TR and the quality factor Q of the MOS varactor 400 may be achieved by reducing the depletion capacitance (e.g., Cmin) of the MOS varactor 400. Various aspects of the present disclosure provide techniques for novel doping of the MOS varactor 400 to reduce the depletion capacitance. For example, an N-well doping of the MOS varactor 400 may have a deep N-well doping concentration less than a peak doping concentration of $4\,e10^{15}$. In one configuration, the well doping of the MOS varactor 400 may be at a peak doping level concentration of 4 e10$^{15}$ up to a predetermined distance below the channel. A channel surface dopant concentration of the MOS varactor 400 may be less than a conventional uniform N-well doping concentration of 4 e10$^{17}$, for example.

Figure 5:
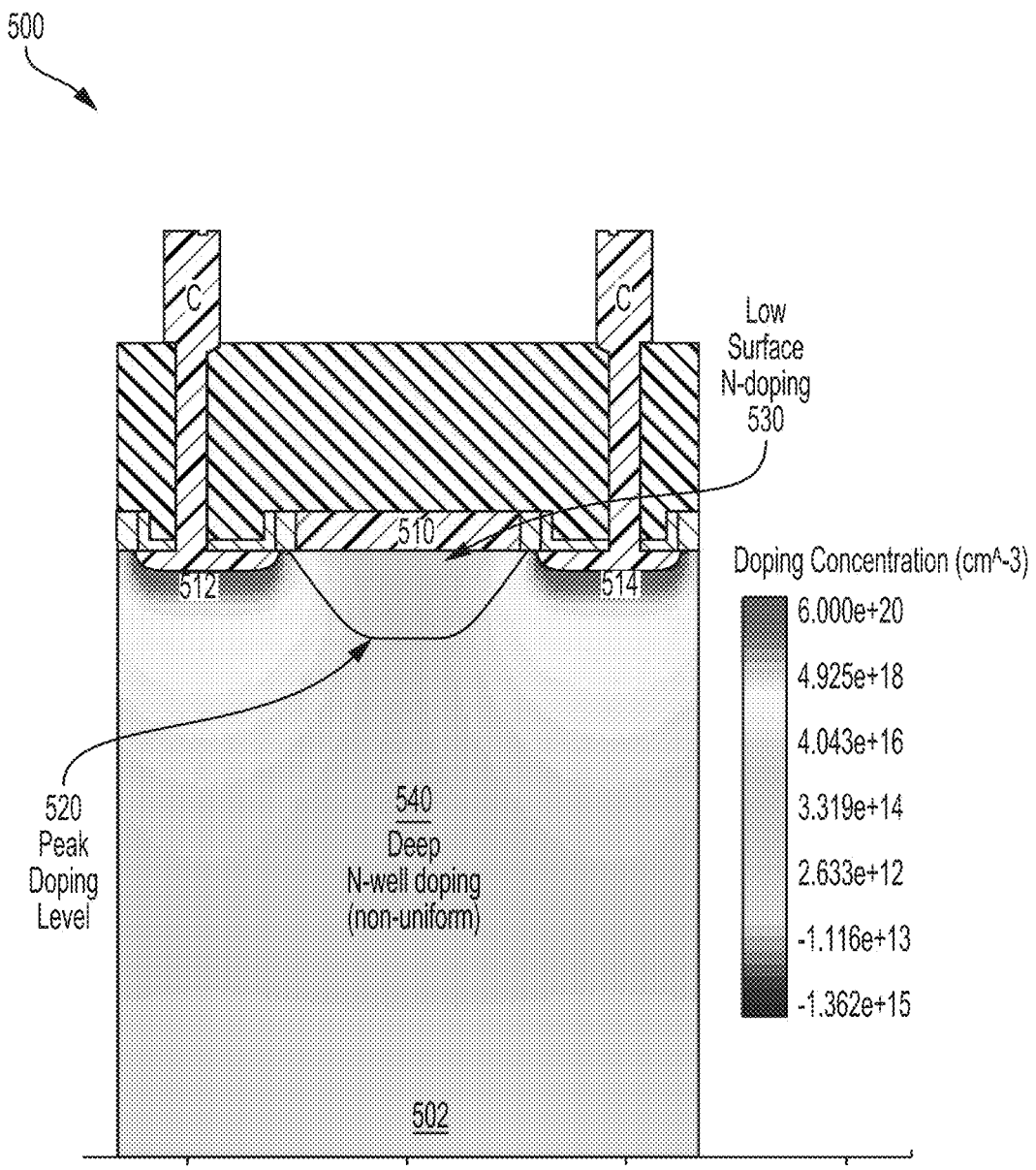
FIG. 5 is a cross-sectional view of the MOS varactor of FIG. 4, illustrating the novel well doping, according to aspects of the present disclosure.

FIG. 5 is a cross-sectional view of the MOS varactor of, for example, FIG. 4, illustrating the novel well doping, according to aspects of the present disclosure. The cross-sectional view illustrates the novel doping concentration of a MOS varactor 500, according to aspects of the present disclosure. Representatively, a substrate 502 of the MOS varactor 500 is shown with a channel surface N-doping 530 in a channel region below a gate 510. The MOS varactor 500 also has a first diffusion region 512 and a second diffusion region 514. A peak doping level 520 of the substrate 502 is shown a predetermined distance below the gate G. Contacts C to the first diffusion region 512 and the second diffusion region 514 are also shown.

The doping concentration of the substrate 502 may include a deep well doping 540 that is non-uniform as compared to the uniform doping concentration of conventional MOS varactors. The conventional MOS varactor 500 may have a uniform N-doping around 4 e10$^{17}$. In the present disclosure, instead of using the uniform high level N-doping of conventional MOS varactors, a lower, non-uniform deep N-well doping occurs in the substrate 502. An N-well doping below the channel (e.g., 0.3-0.4 µm below) may exhibit a peak doping level at 4 e10$^{15}$. In this configuration, the deep N-well doping 540 exhibits a lower doping (e.g., 4 e10$^{15}$), for example, two orders of magnitude lower than the uniform N-doping of conventional MOS varactors.

In operation, the MOS varactor 500 having the deep N-well doping 540 exhibits an increased tuning ratio (e.g., >15%). The increased tuning ratio TR results from a lowered depletion capacitance caused by using the deep N-well doping 540 in the substrate 502. In addition, a significant increase in quality factor Q (e.g., >200%) is achieved at depletion (e.g., when a gate to source voltage (Vgs)=−0.9). Both of these improvements will help RF circuit performance when implementing the MOS varactor 500.

Figure 6A:
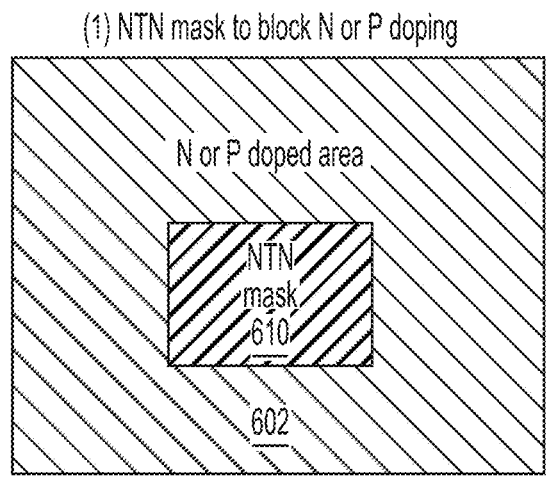
FIGS. 6A and 6B are block diagrams illustrating a process of fabricating a metal oxide semiconductor (MOS) varactor having no intentional channel doping, according to aspects of the present disclosure.
Figure 6B:
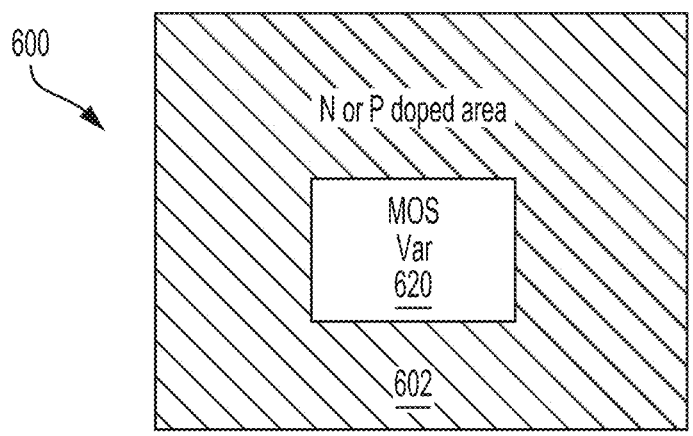

FIGS. 6A and 6B are block diagrams illustrating a process of fabricating a metal oxide semiconductor (MOS) varactor having no intentional channel doping, according to aspects of the present disclosure. As shown in FIG. 6A, an additional native transistor (NTN) mask 610 (or well implant block) is used to block a portion of a substrate from N-doping or P-doping. As shown in FIG. 6B, a MOS varactor 600 is formed having a doped area 602 (N-type/P-type) surrounding an intrinsic semiconductor area 620. The intrinsic semiconductor area 620 is undoped and has a native polarity corresponding to the polarity of the diffusion regions of the MOS varactor 600. That is, the MOS varactor 600 is formed with no intentional channel doping in the intrinsic semiconductor area 620, as further illustrated in FIGS. 7A and 7B.

Figure 7A:
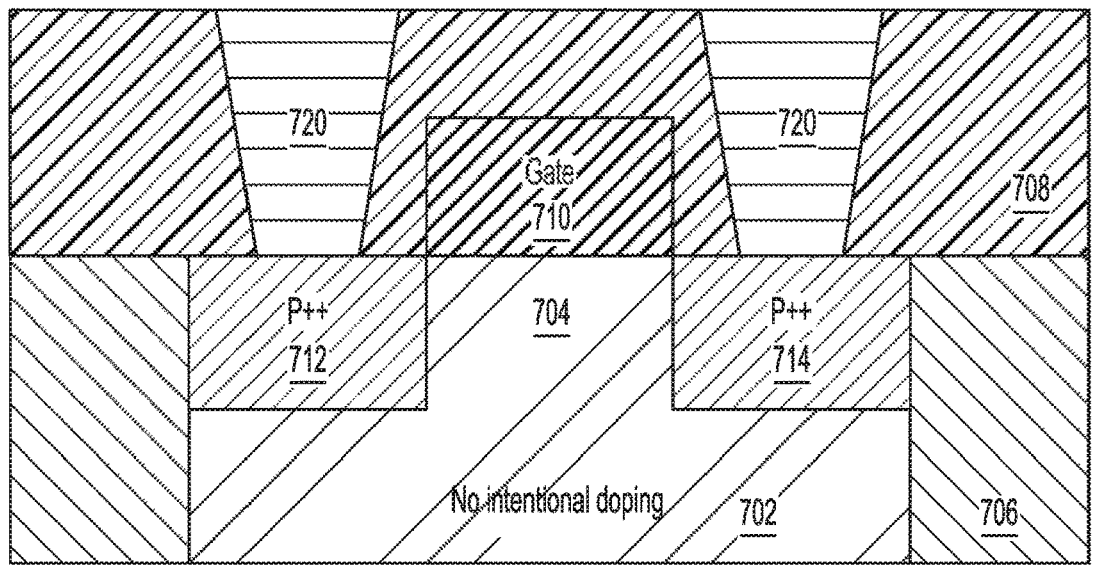
FIGS. 7A and 7B are cross-sectional views of metal oxide semiconductor (MOS) varactors having no intentional channel doping, according to aspects of the present disclosure.
Figure 7B:
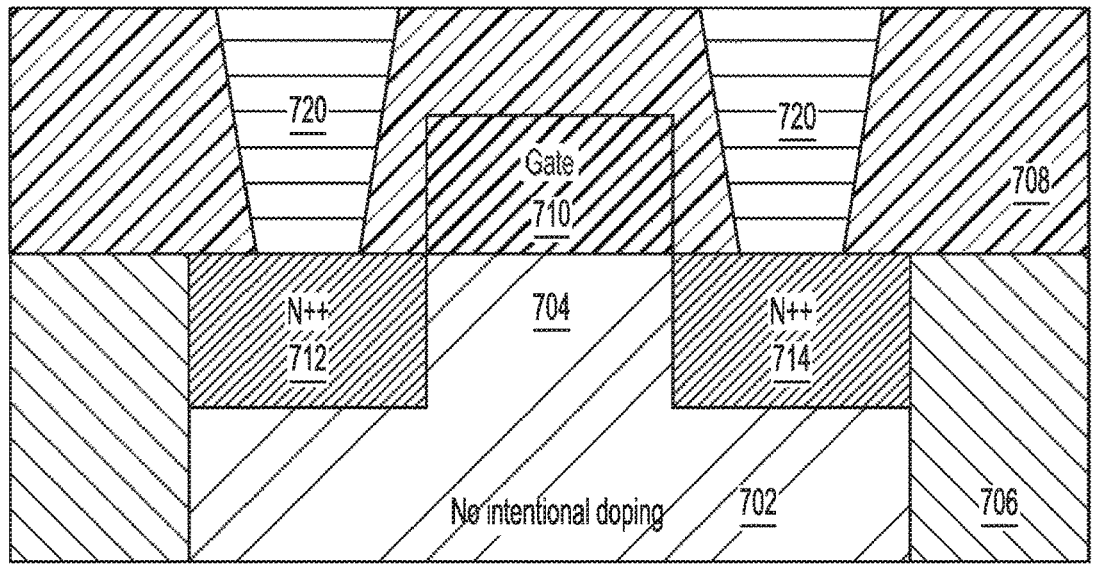

FIGS. 7A and 7B are cross-sectional views of metal oxide semiconductor (MOS) varactors having no intentional channel doping, according to aspects of the present disclosure. FIG. 7A illustrates a MOS varactor 700, including a first diffusion region 712, a second diffusion region 714, and a P-Type channel 704 formed between the first diffusion region 712 and the second diffusion region 714 in a substrate 702. A gate 710 is on the channel 704, and a gate dielectric (not shown) may be between the gate 710 and the channel 704. Middle-of-line trench contacts 720 (e.g., CA trench contacts) to the first diffusion region 712 and the second diffusion region 714 are also shown. In addition, the MOS varactor 700 includes a dielectric layer 708. In this configuration, the MOS varactor 700 has no intentional doping in the channel 704 and other parts of the substrate 702. A doped region 706 of the substrate 702 is also shown. The MOS varactor 700 is also shown with P++ diffusion regions (e.g., 712 and 714).

FIG. 7B illustrates a MOS varactor 750, also including a first diffusion region 712, a second diffusion region 714, and an N-Type channel 704 formed between the first diffusion region 712 and the second diffusion region 714 in a substrate 702. A gate 710 is also on the channel 704, and a gate dielectric (not shown) may be between the gate 710 and the channel 704. Middle-of-line trench contacts 720 to the first diffusion region 712 and the second diffusion region 714 are also shown as well as a dielectric layer 708. In this configuration, the MOS varactor 750 also includes no intentional channel doping in channel 704 and other parts of the substrate 702. A doped region 706 of the substrate 702 is also shown. The MOS varactor 750 is shown with N++ diffusion regions (e.g., 712 and 714).

Figure 8:
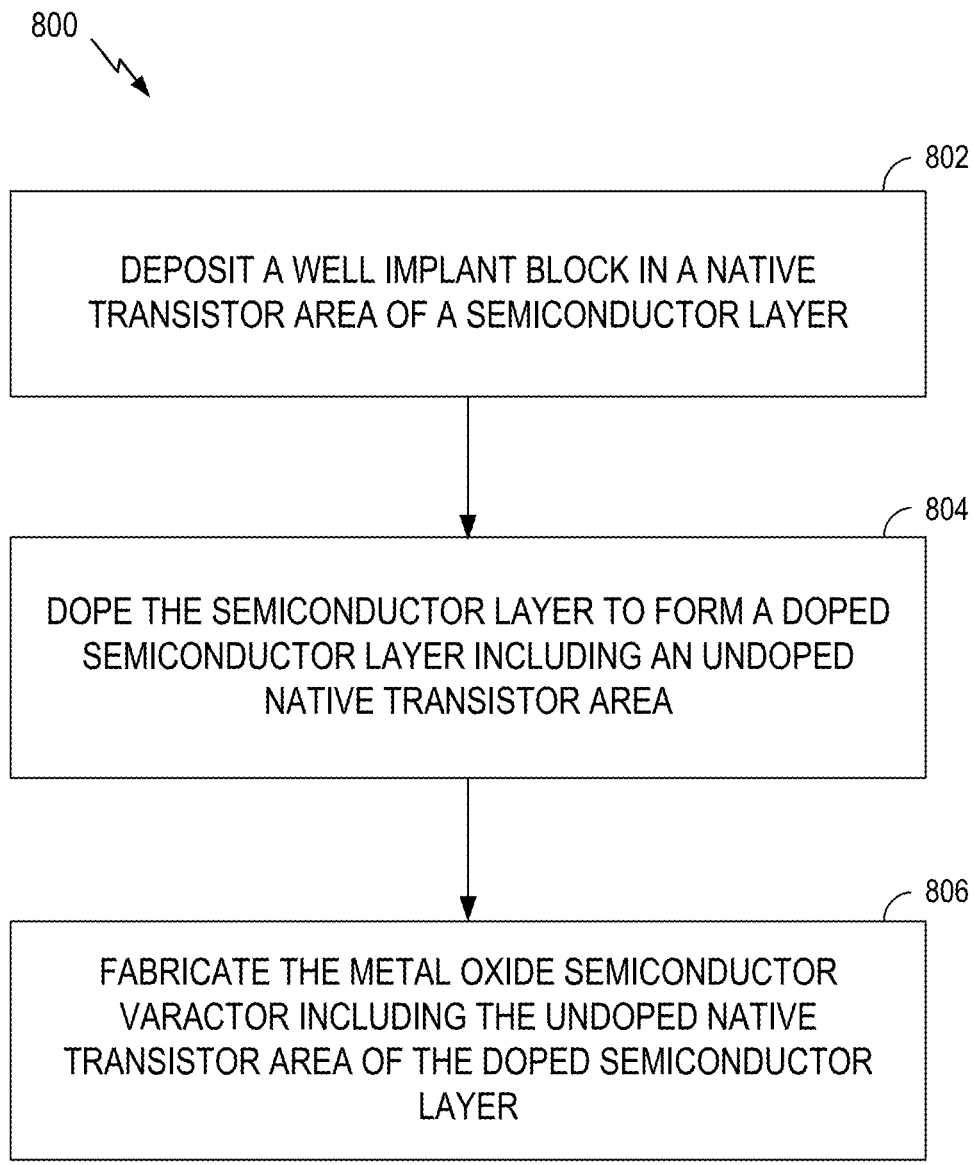
FIG. 8 illustrates a method for novel doping of a metal oxide semiconductor (MOS) varactor, according to aspects of the present disclosure.

FIG. 8 is a process flow diagram illustrating a method of fabricating a metal oxide semiconductor (MOS) varactor according to aspects of the present disclosure. A method 800 begins at block 802, in which a well implant block is deposited in a native transistor area of a semiconductor layer. For example, a well implant block (e.g., a native transistor (NTN) mask) is deposited to block an N-type or P-type doping of a semiconductor (e.g., silicon) layer. At block 804, the semiconductor layer is doped to form a doped semiconductor layer including an undoped native transistor area. At block 806, the MOS varactor is fabricated and includes the undoped native transistor area of the doped semiconductor layer. A MOS varactor may be fabricated as shown in FIG. 7A, by forming a first diffusion region 712 of a first polarity (e.g., P++), a second diffusion region 714 of the first polarity, and a channel 704 between the first diffusion region 712 and the second diffusion region 714. A gate 710 of the MOS varactor 700 is fabricated on the channel 704. Thus, a P-type or N-type (e.g., FIG. 7B) MOS varactor is formed including an undoped region of a substrate 702 surround by a doped region 706.

According to an aspect of the present disclosure, a MOS varactor is described. In one configuration, the MOS varactor includes supporting means having a channel surface dopant concentration less than 4 e10$^{17}$. The supporting means may be the semiconductor substrate. In another aspect, the aforementioned means may be any module or any apparatus or material configured to perform the functions recited by the aforementioned means.

Figure 9:
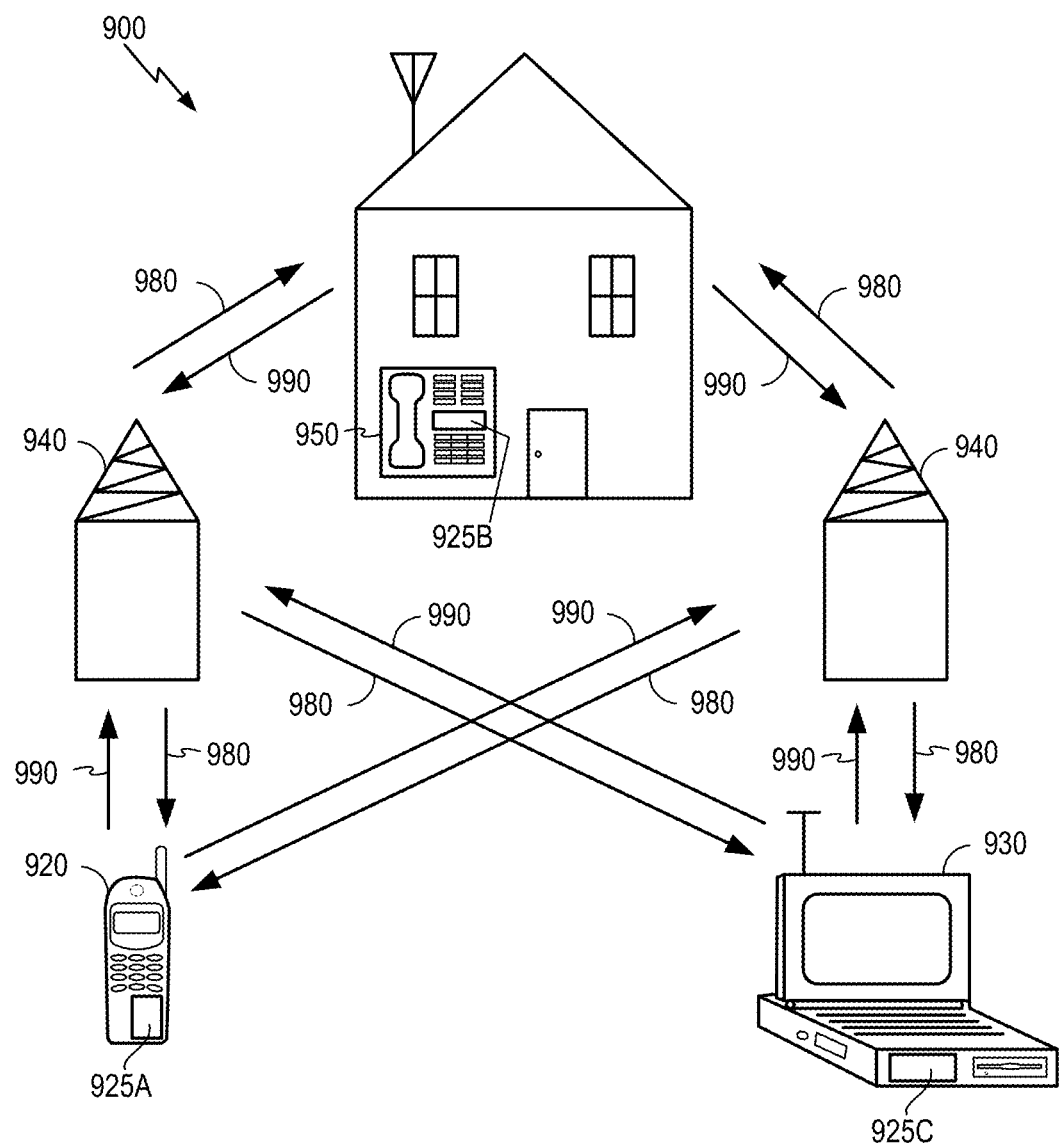
FIG. 9 is a block diagram showing an exemplary wireless communications system in which an aspect of the present disclosure may be advantageously employed.

FIG. 9 is a block diagram showing an exemplary wireless communications system 900 in which an aspect of the present disclosure may be advantageously employed. For purposes of illustration, FIG. 9 shows three remote units 920, 930, and 950 and two base stations 940. It will be recognized that wireless communications systems may have many more remote units and base stations. Remote units 920, 930, and 950 include IC devices 925A, 925C, and 925B that include the disclosed varactor. It will be recognized that other devices may also include the disclosed varactor, such as the base stations, switching devices, and network equipment. FIG. 9 shows forward link signals 980 from the base station 940 to the remote units 920, 930, and 950 and reverse link signals 990 from the remote units 920, 930, and 950 to base station 940.

In FIG. 9, remote unit 920 is shown as a mobile telephone, remote unit 930 is shown as a portable computer, and remote unit 950 is shown as a fixed location remote unit in a wireless local loop system. For example, the remote units may be a mobile phone, a hand-held personal communications systems (PCS) unit, a portable data unit such as a personal data assistant, a GPS enabled device, a navigation device, a set top box, a music player, a video player, an entertainment unit, a fixed location data unit such as meter reading equipment, or other devices that store or retrieve data or computer instructions, or combinations thereof. Although FIG. 9 illustrates remote units according to the aspects of the present disclosure, the present disclosure is not limited to these exemplary illustrated units. Aspects of the present disclosure may be suitably employed in many devices, which include the disclosed varactor.

Figure 10:
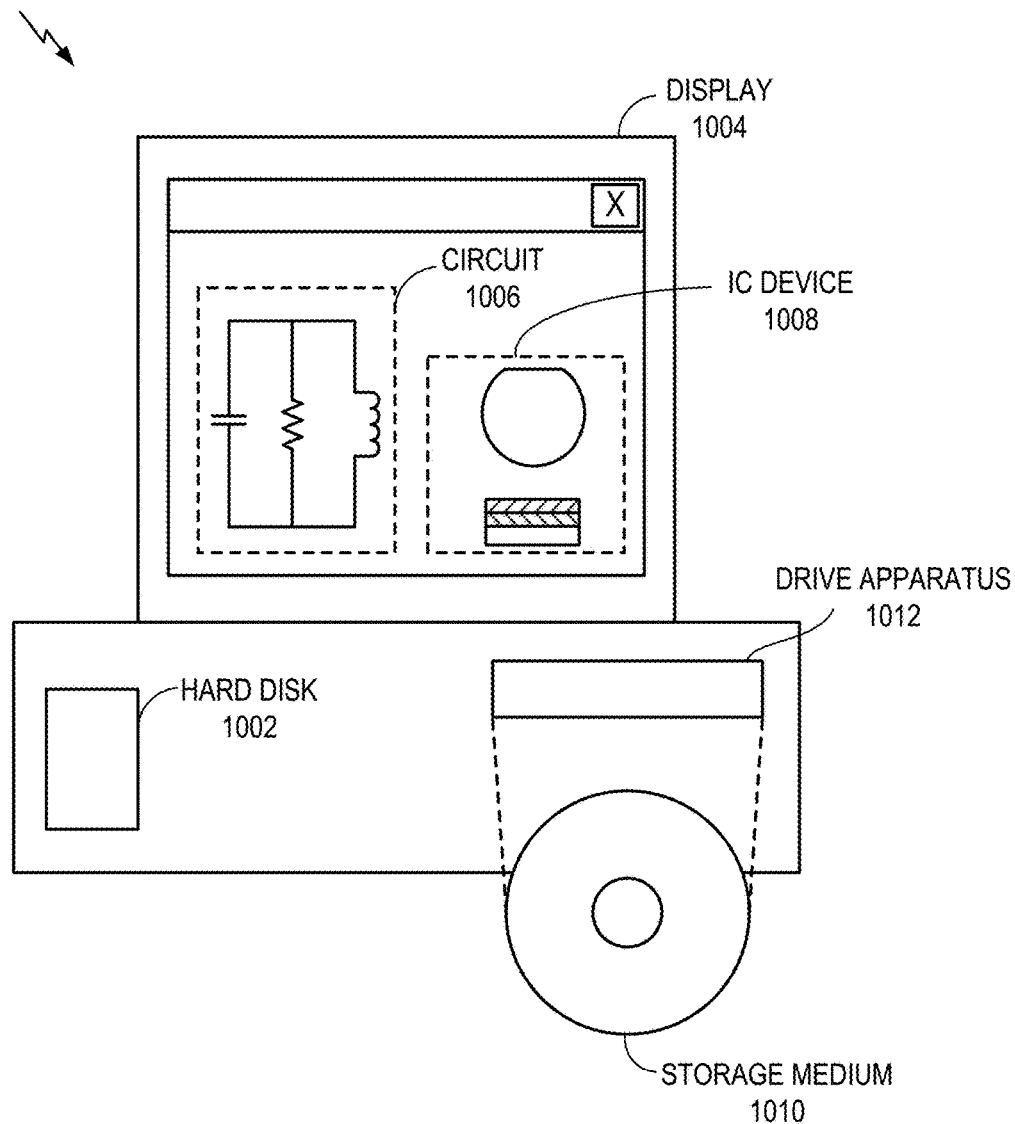
FIG. 10 is a block diagram illustrating a design workstation used for circuit, layout, and logic design of a metal oxide semiconductor (MOS) varactor structure according to one configuration.

FIG. 10 is a block diagram illustrating a design workstation used for circuit, layout, and logic design of an IC structure, such as the varactor disclosed above. A design workstation 1000 includes a hard disk 1002 containing operating system software, support files, and design software such as Cadence or OrCAD. The design workstation 1000 also includes a display 1004 to facilitate design of a circuit 1006 or an IC device 1008 including a MOS varactor. A storage medium 1010 is provided for tangibly storing the design of the circuit 1006 or the IC device 1008 including a MOS varactor. The design of the circuit 1006 or the IC device 1008 including a MOS varactor may be stored on the storage medium 1010 in a file format such as GDSII or GERBER. The storage medium 1010 may be a CD-ROM, DVD, hard disk, flash memory, or other appropriate device. Furthermore, the design workstation 1000 includes a drive apparatus 1012 for accepting input from or writing output to the storage medium 1010.

Data recorded on the storage medium 1010 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1010 facilitates the design of the circuit 1006 or the IC device 1008 including a MOS varactor by decreasing the number of processes for designing semiconductor wafers.

For a firmware and/or software implementation, the methodologies may be implemented with modules (e.g., procedures, functions, and so on) that perform the functions described herein. Machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the present disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the present disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the present disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The steps of a method or algorithm described in connection with the present disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communications media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), and Blu-ray disc where disks usually reproduce data magnetically, while discs reproduce data optically with lasers. Combinations of the above should also be included within the scope of computer-readable media.

The previous description of the present disclosure is provided to enable any person skilled in the art to make or use the present disclosure. Various modifications to the present disclosure will be readily apparent to those skilled in the art, and the generic principles defined herein may be applied to other variations without departing from the spirit or scope of the present disclosure. Thus, the present disclosure is not intended to be limited to the examples and designs described herein, but is to be accorded the widest scope consistent with the principles and novel features disclosed herein.

What is claimed is:

1. A metal oxide semiconductor (MOS) varactor, comprising: a first diffusion region of a first polarity on a semiconductor substrate; a second diffusion region of the first polarity on the semiconductor substrate; and a channel of the first polarity between the first diffusion region and the second diffusion region on the semiconductor substrate, the channel having a surface dopant concentration less than $4 \times 10^{17}$ cm$^{-3}$.

2. The MOS varactor of claim 1, in which the semiconductor substrate comprises a deep N-well doping.

3. The MOS varactor of claim 1, in which the semiconductor substrate comprises a peak doping concentration of $4\mathrm{e}10^{15}$ cm$^{-3}$ at a predetermined distance below the channel.

4. The MOS varactor of claim 1, in which the semiconductor substrate comprises a deep N-well doping concentration less than $4\mathrm{e}10^{15}$ cm$^{-3}$.

5. The MOS varactor of claim 1, in which the semiconductor substrate is undoped.

6. The MOS varactor of claim 1, integrated into a mobile phone, a set top box, a music player, a video player, an entertainment unit, a navigation device, a computer, a hand-held personal communications systems (PCS) unit, a portable data unit, and/or a fixed location data unit.

7. A method of fabricating a metal oxide semiconductor (MOS) varactor, comprising:
depositing a well implant block in a native transistor area of a semiconductor layer;
doping the semiconductor layer to form a doped semiconductor layer including an undoped native transistor area; and
fabricating the MOS varactor to include the undoped native transistor area of the doped semiconductor layer.

8. The method of claim 7, in which fabricating the MOS varactor comprises:
removing the well implant block to expose the undoped native transistor area of the semiconductor layer;
forming a first diffusion region of a first polarity and a second diffusion region of the first polarity in the undoped native transistor area; and
depositing a gate over an undoped channel region between the first diffusion region and the second diffusion region of the first polarity.

9. The method of claim 7, further comprising forming contacts to a first diffusion region and a second diffusion region of the MOS varactor.

10. The method of claim 7, further comprising integrating the MOS varactor into a mobile phone, a set top box, a music player, a video player, an entertainment unit, a navigation device, a computer, a hand-held personal communications systems (PCS) unit, a portable data unit, and/or a fixed location data unit.

11. The method of claim 7, in which fabricating the MOS varactor comprises:
removing the well implant block to expose the undoped native transistor area of the semiconductor layer;
doping the undoped native transistor area of the semiconductor layer to form a first diffusion region of a first polarity, a second diffusion region of the first polarity, and a channel region of the first polarity between the first diffusion region and the second diffusion region, wherein the channel region has a surface dopant concentration less than $4\mathrm{e}10^{17}$ cm$^{-3}$; and
depositing a gate on the channel region.

12. The method of claim 11, in which doping the undoped native transistor area comprises doping the undoped native transistor area with an N-type doping.

13. A radio frequency (RF) front-end (RFFE) device, comprising: a transceiver including a metal oxide semiconductor (MOS) varactor, comprising a first diffusion region of a first polarity on a semiconductor substrate, a second diffusion region of the first polarity on the semiconductor substrate, and a channel of the first polarity between- and directly contacting the first diffusion region and the second diffusion region on the semiconductor substrate, the channel having a surface dopant concentration less than $4 \times 10^{17}$ cm$^{-3}$; and an antenna coupled to an output of the transceiver.

14. The RFFE device of claim 13, in which the semiconductor substrate comprises a deep N-well doping.

15. The RFFE device of claim 13, in which the semiconductor substrate comprises a peak doping concentration of $4e10^{15}$ cm$^{-3}$ at a predetermined distance below the channel.

16. The RFFE device of claim 13, in which the semiconductor substrate comprises a deep N-well doping concentration less than $4e10^{15}$ cm$^{-3}$.

17. The RFFE device of claim 13, in which the semiconductor substrate is undoped.

18. The RFFE device of claim 13, integrated into a mobile phone, a set top box, a music player, a video player, an entertainment unit, a navigation device, a computer, a handheld personal communications systems (PCS) unit, a portable data unit, and/or a fixed location data unit.

* * * * *